(12) United States Patent
Tzeng

(10) Patent No.: US 6,812,805 B2
(45) Date of Patent: Nov. 2, 2004

(54) DIFFERENTIAL TRANSMISSION LINE FOR HIGH BANDWIDTH SIGNALS

(75) Inventor: Liang D. Tzeng, Belle Mead, NJ (US)

(73) Assignee: Multiplex, Inc., South Plainfield, NJ (US)

(*) Notice: Subject to any disclaimer, the term of this patent is extended or adjusted under 35 U.S.C. 154(b) by 0 days.

(21) Appl. No.: 10/205,882

(22) Filed: Jul. 26, 2002

(65) Prior Publication Data

US 2003/0034854 A1 Feb. 20, 2003

Related U.S. Application Data

(60) Provisional application No. 60/312,373, filed on Aug. 16, 2001, and provisional application No. 60/325,875, filed on Sep. 28, 2001.

(51) Int. Cl.[7] .............................................. H03H 7/38
(52) U.S. Cl. ........................ 333/33; 333/246; 333/247; 333/254; 333/260
(58) Field of Search ......................... 333/33, 246, 247, 333/254, 260, 4, 5, 238; 257/664, 693

(56) References Cited

U.S. PATENT DOCUMENTS

| | | | | |
|---|---|---|---|---|
| 4,412,566 A | * | 11/1983 | Huffnagle et al. | 140/147 |
| 4,600,907 A | * | 7/1986 | Grellman et al. | 333/246 |
| 4,624,515 A | * | 11/1986 | Brush et al. | 439/95 |
| 6,023,209 A | * | 2/2000 | Faulkner et al. | 333/238 |
| 6,215,377 B1 | * | 4/2001 | Douriet | 333/247 |
| 6,426,686 B1 | * | 7/2002 | Douriet et al. | 333/247 |
| 6,452,254 B2 | * | 9/2002 | Bosch et al. | 257/664 |
| 6,535,089 B1 | * | 3/2003 | Iio | 333/238 |
| 6,570,464 B1 | * | 5/2003 | Tanabe et al. | 333/34 |
| 6,600,395 B1 | * | 7/2003 | Handforth et al. | 333/238 |
| 6,603,376 B1 | * | 8/2003 | Handforth et al. | 333/238 |
| 6,674,347 B1 | * | 1/2004 | Maruhashi et al. | 333/238 |
| 6,686,808 B1 | * | 2/2004 | Sugawara et al. | 333/1 |
| 2003/0197257 A1 | * | 10/2003 | Nagase et al. | 257/678 |

* cited by examiner

Primary Examiner—Michael Tokar
Assistant Examiner—Khai Nguyen
(74) Attorney, Agent, or Firm—Testa, Hurwitz & Thibeault

(57) ABSTRACT

In one aspect, the invention relates to a waveguide structure for differential transmission lines. The waveguide structure includes a first ground structure, a first signal line, a second ground structure, a second signal line, a third ground structure. The first signal line is typically positioned adjacent and substantially parallel to the first ground structure. The second ground structure has a first separation distance from the first ground structure and is typically positioned adjacent and substantially parallel to the first signal line. The first signal line is typically positioned between both the first and second ground structures. The second signal line typically a has a second separation distance from the first signal line and is positioned adjacent and substantially parallel to the second ground structure. The second ground structure is typically positioned between both the first and second signal lines. The third ground structure typically has a third separation distance from the second ground structure and is positioned adjacent and substantially parallel to the second signal line. The second signal line is typically positioned between both the second and third ground structures.

5 Claims, 4 Drawing Sheets

DIFFERENTIAL TRANSMISSION LINE FOR HIGH BANDWIDTH SIGNALS

CROSS-REFERENCE TO RELATED APPLICATIONS

This application claims the benefits of provisional U.S. Patent Application Ser. No. 60/312,373 filed on Aug. 16, 2001 and U.S. Patent Application Ser. No. 60/325,875 filed on Sep. 28, 2001 the disclosures of which are hereby incorporated herein by reference in their entirety.

FIELD OF THE INVENTION

The present invention generally relates to the field of signal propagation. In particular, the present invention relates to a waveguide configuration for signal propagation in telecommunication devices.

BACKGROUND OF THE INVENTION

Differences in voltage are central to the operation of virtually all electrical circuits. Differential signaling relates to a particular application of this general concept. Specifically, two signals are sent from one device as outputs. These two signals are received by a second device as inputs. The information contained within the signals is derived from the differences in voltage or current between them by the second device. This allows various external noise signals to be subtracted out when the inputs are processed. The differences in signals convey the information rather than one signal evaluated with respect to a ground. When transmitting at very high data rates, over long distances and through noisy environments, single-ended transmission is often inadequate. In these applications, differential data transmission offers superior performance.

The primary disadvantages of differential signaling result from the additional space, design complexity, and production costs association with increasing the number of pins, traces and tranceivers. These disadvanatges can limit the overall efficiency and suitability for a differential signaling system in different operating environments. Therefore a need exists for communication devices and differential signaling systems that maintain the advantages while reducing the inefficiencies associated with using differential based signaling techniques.

SUMMARY OF THE INVENTION

In one aspect, the invention relates to a waveguide structure for differential transmission lines including first, second, and third ground structures (e.g., ground planes) and first and second signal lines. The width of the first signal line and the separation between the first signal line and each of the first and second ground structures are sufficient to permit fabrication of a circuit element on the first signal line in some embodiments. In another aspect, the invention relates to providing complementary decoupled differential transmission line connections between signal transmission lines and optical-electronic receivers and demultiplexing device. In another aspect, the invention relates to connecting communication devices with an electrical ground (G) and signal (S) connections arranged in a G-S-G-S-G a configuration.

In one aspect, the invention relates to a waveguide structure for differential transmission lines. The waveguide structure includes a first ground structure, a first signal line, a second ground structure, a second signal line, a third ground structure. The first signal line is typically positioned adjacent and substantially parallel to the first ground structure. The second ground structure has a first separation distance from the first ground structure and is typically positioned adjacent and substantially parallel to the first signal line. The first signal line is typically positioned between both the first and second ground structures. The second signal line typically has a second separation distance from the first signal line and is positioned adjacent and substantially parallel to the second ground structure. The second ground structure is typically positioned between both the first and second signal lines. The third ground structure typically has a third separation distance from the second ground structure and is positioned adjacent and substantially parallel to the second signal line. The second signal line is typically positioned between both the second and third ground structures.

In one embodiment, the first signal line has a substantially constant width. The first and second signal lines have a substantially constant width in another embodiment. In another embodiment, the width of the first signal line and the separation distances are sufficiently sized to permit fabrication of a circuit element on the first signal line. In another embodiment, the width of the first and second signal lines and the separation distances are sufficiently sized to permit fabrication of a circuit element on the first signal line and second signal lines.

In another aspect, the invention relates to a differential transmission line system. The differential transmission line system includes a first communication device, a second communication device, and a differential signal lire. The first communication device typically has at least five pin inputs. The second communication device typically has at least five pin outputs. The differential signal line typically has at least ten contacts arranged in a decoupled configuration. The first and second communication devices are typically connected to the differential signal line in a differential decoupled configuration. In one embodiment, the differential transmission line system further comprises two signal lines and three ground strictures.

In another aspect, the invention relates to a waveguide structure for differential transmission lines. The waveguide structure typically includes at least two signal lines and a plurality of ground structures, wherein each signal line is adjacent to two ground structures.

DETAILED DESCRIPTION

Figure 1:
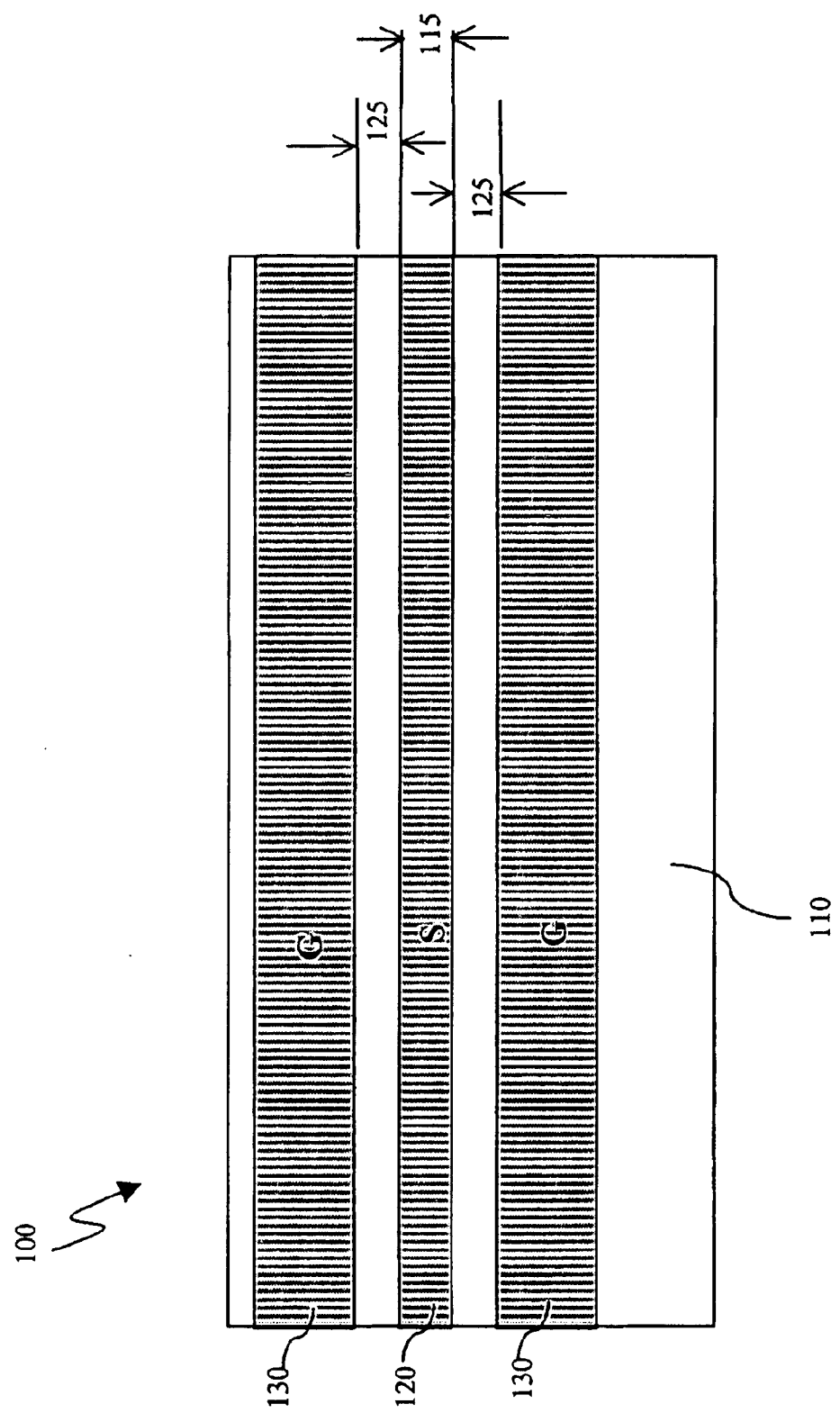
FIG. 1 is a schematic cross-sectional view of a transmission line as known in the prior art.

FIG. 1 illustrates a known single-ended coplanar ground-signal-ground (GSG) type transmission line 100 (e.g., waveguide on a circuit board). The impedance of the transmission line is dependent on the material composition and thickness of the substrate 110, the width 115 of the signal line 120 and the separation 125 between the signal line 120 and the ground plane 130. In order for a high bandwidth signal to propagate without distortion, a transmission line that accurately presents a design impedance (e.g., 50 Ω) to the signal is required.

Figure 2:
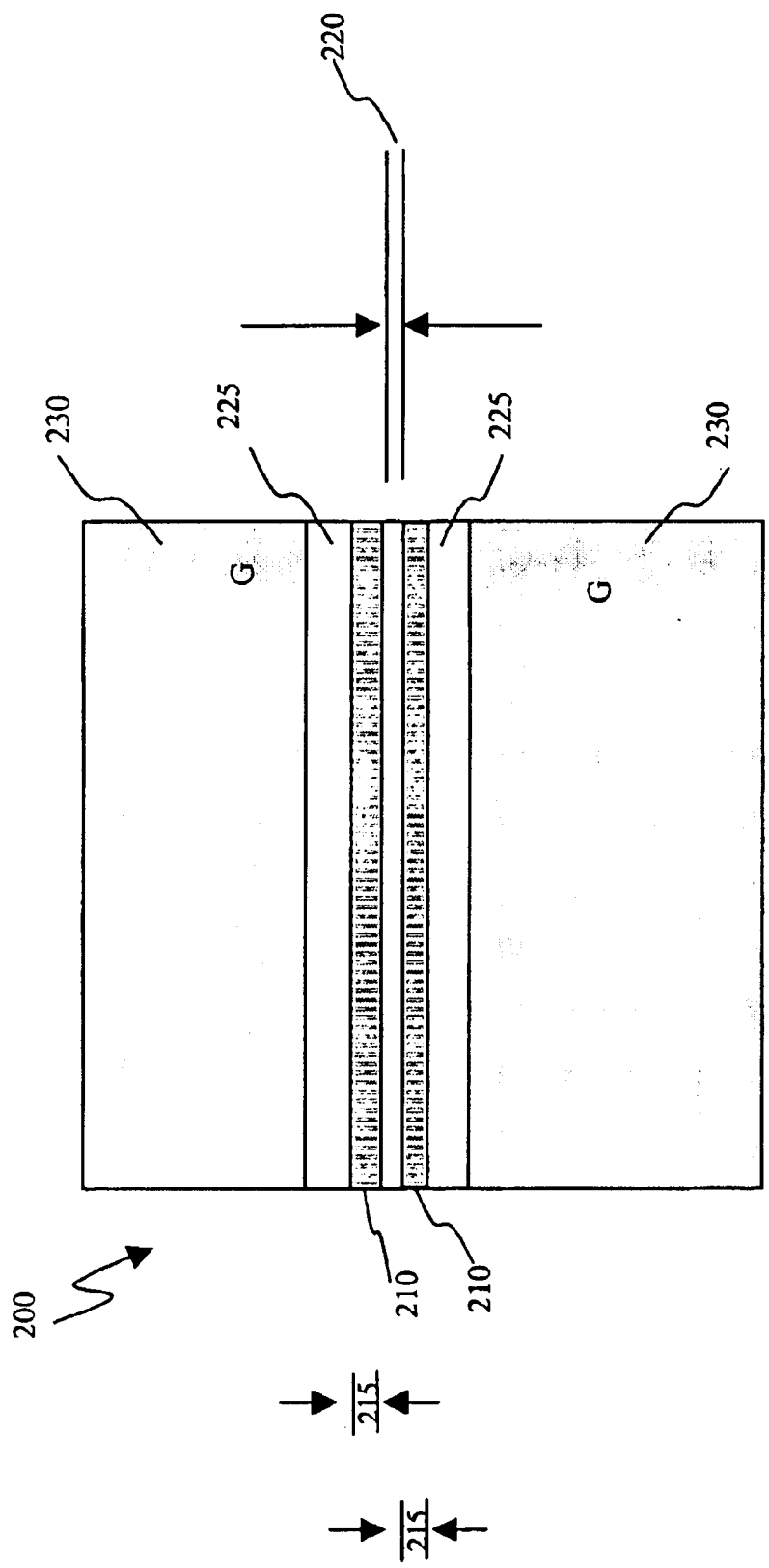
FIG. 2 is a schematic cross-sectional view of another transmission line as known in the prior art.

FIG. 2 illustrates a differential transmission line having a ground-signal-signal-ground (GSSG) configuration 200 as is known in the prior art. The signal lines 210 support a differential signal mode. To achieve a predetermined impedance, the width 215 of the signal lines 210 and the separation 220 between the signal lines 210 must be accurately controlled. The properties of the substrate 225 can also be modified to affect the impedance. Typically the separation 220 is small (e.g., on the order of 0.005 inches) compared to the width 215 of the signal lines (e.g., typically in the range of 0.015 to 0.020 inches). The separated signal lines 210 are shown in between two ground structures 230.

Most receiver module packages on the market today have an output signal strip line configuration which relies on the differential signals being coupled as shown in FIG. 2. This pinout arrangement is referred to as the G-S-S-G configuration or "coupled." For most applications, these same receiver module packages with the G-S-S-G pinout will require the optical receiver module to be interfaced to a demultiplexing integated circuit to remove the various multiplexed signals. Demultiplexing integrated circuits typically have input signal pinouts with a G-S-G-S-G configuration, which is also defined as a differential decoupled configuration. In one aspect the invention relates to designing various optical devices, such as optoelectronic receivers, with a signal leads in a G-S-G-S-G configuration to more easily interface with other communication devices such as a demultiplexing integrated circuit based devices.

In some applications, circuit components are required along the transmission lines. For example, AC coupling requires inclusion of a capacitor on each signal line. Still referring to FIG. 2, in many instances, the small separation 220 between the signal lines for a GSSG configuration prohibits integration of the capacitors into the waveguide structures, especially if the application requires large capacitance values.

Figure 3:
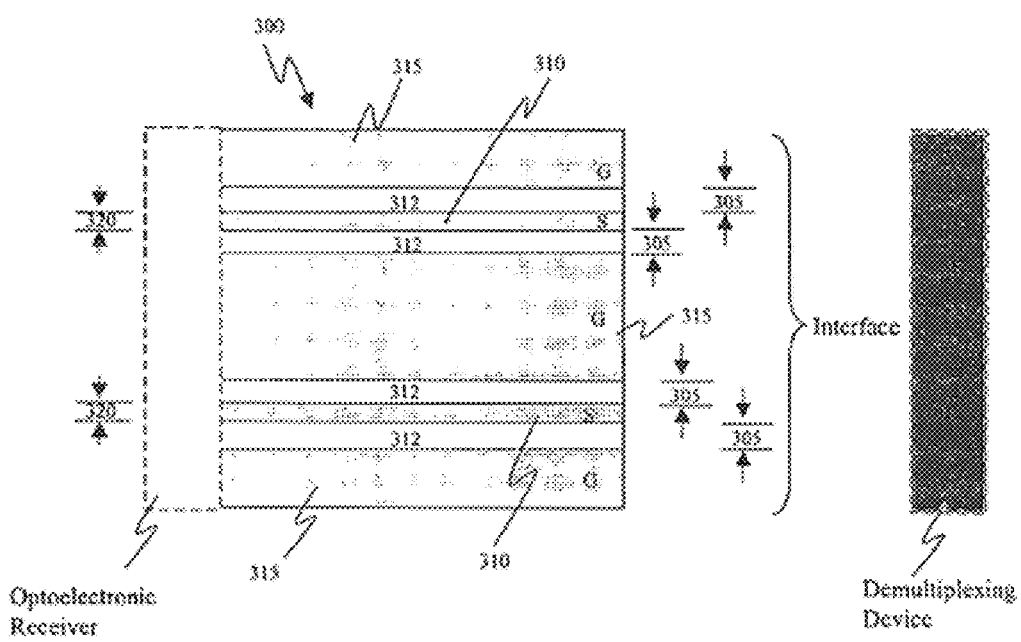
FIG. 3 is a schematic cross-sectional view of a transmission line according to an illustrative embodiment of the invention.

FIG. 3 illustrates a differential transmission line having a ground-signal-ground-signal-ground (GSGSG) configuration 300. This GSGSG configuration of signal lines and ground structure is also referred to as a differential decoupled configuration. The separation 305 between each signal line 310 and the adjacent ground plane 315 is substantially greater than the separation 220 between the signal lines 210 of FIG. 2 in this illustrative embodiment.

Figure 4:
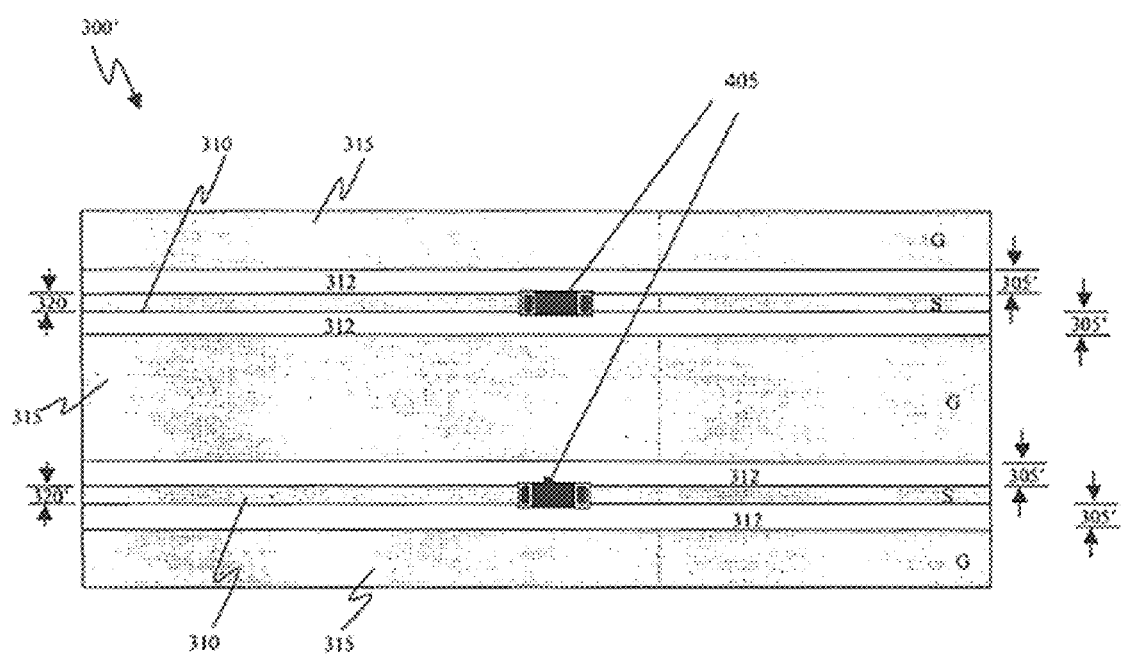
FIG. 4 is a view of FIG. 3 with an incorporated electrical element according to an illustrative embodiment of the invention.

Circuit elements, such as capacitors 405, can be integrated into the waveguide structure 300' as illustrated in FIG. 4. The substrate material 312 can be modified to accommodate additional circuit elements in various embodiments. Additional circuit elements include resistors, inductors, diodes, transistors, integrated circuit devices, and any other suitable electronic device. Referring to FIG. 4, if the circuit element is too large to be accommodated by the nominal width 320 and separations 305' of the transmission lines, the structure of the transmission line can be arranged, for example, by expanding the line width 320' and separation 305' to accept the circuit element and achieve the desired impedance. The line widths and separations in all aspects of the invention can be varied based on the requirements of a giving signal transmission set up.

While the present invention has been described in terms of certain exemplary preferred embodiments, it will be readily understood and appreciated by one of ordinary skill in the art that it is not so limited and that many additions, deletions and modifications to the preferred embodiments may be made within the scope of the invention as hereinafter claimed. Accordingly, the scope of the invention is limited only by the scope of the appended claims.

What is claimed is:

1. A waveguide structure adapted for use in an optoelectronic receiver comprising:

a substrate connected to the optoelectronic receiver; and an interface for coupling the optoelectronic receiver to a demultiplexing device, the interface comprising, a first ground structure embedded in the substrate;

a first signal line embedded in the substrate and positioned adjacent and substantially parallel to the first ground structure;

a second ground structure embedded in the substrate, having a first separation distance from the first ground structure, positioned adjacent and substantially parallel to the first signal line, wherein the first signal line is positioned between both the first and second ground structures;

a second signal line embedded in the substrate, having a second separation distance from the first signal line, positioned adjacent and substantially parallel to the second ground structure, wherein the second ground structure is positioned between both the first and second signal lines; and a third ground structure embedded in the substrate, having a third separation distance from the second ground structure, positioned adjacent and substantially parallel to the second signal line, wherein the second signal line is positioned between both the second and third ground structures.

2. The waveguide structure of claim 1 wherein the first signal line has a substantially constant width.

3. The waveguide structure of claim 1 wherein the first and second signal lines have a substantially constant width.

4. The waveguide structure of claim 2 wherein the width of the first signal line and the separation distances are sufficiently sized to permit fabrication of a circuit element on the first signal line.

5. The waveguide structure of claim 3 wherein the width of the first and second signal lines and the separation distances are sufficiently sized to permit fabrication of a circuit element on the first signal line and second signal lines.

* * * * *